United States Patent
Cretu et al.

(10) Patent No.: US 12,009,832 B2
(45) Date of Patent: Jun. 11, 2024

(54) SAMPLING SWITCH CIRCUITS

(71) Applicant: Socionext Inc., Kanagawa (JP)

(72) Inventors: Vlad Cretu, Maidenhead (GB); Armin Jalili Sebardan, Maidenhead (GB)

(73) Assignee: SOCIONEXT INC., Kanagawa (JP)

( * ) Notice: Subject to any disclaimer, the term of this patent is extended or adjusted under 35 U.S.C. 154(b) by 112 days.

(21) Appl. No.: 17/837,615

(22) Filed: Jun. 10, 2022

(65) Prior Publication Data

US 2022/0407535 A1    Dec. 22, 2022

(30) Foreign Application Priority Data

Jun. 18, 2021    (EP) .................................... 21180467

(51) Int. Cl.
| | | |
|---|---|---|
| H03M 1/00 | (2006.01) | |
| H03K 17/54 | (2006.01) | |
| H03M 1/12 | (2006.01) | |

(52) U.S. Cl.
CPC .......... *H03M 1/1245* (2013.01); *H03K 17/54* (2013.01)

(58) Field of Classification Search
CPC ....... H03M 1/1245; H03M 1/12; H03M 1/124
USPC ................................. 341/122, 155
See application file for complete search history.

(56) References Cited

U.S. PATENT DOCUMENTS

| | | |
|---|---|---|
| 3,942,039 A | 3/1976 | Kikuchi et al. |
| 5,422,583 A | 6/1995 | Blake et al. |
| 7,816,951 B1 | 10/2010 | Lee |
| 2003/0042936 A1 | 3/2003 | Herrera |
| 2005/0073488 A1* | 4/2005 | Shin ..................... G11C 27/028 345/82 |
| 2013/0033302 A1 | 2/2013 | Ali |
| 2015/0200663 A1 | 7/2015 | Yang et al. |
| 2016/0027528 A1 | 1/2016 | Verbruggen et al. |
| 2016/0104543 A1* | 4/2016 | Powell ................. G11C 27/026 327/96 |

FOREIGN PATENT DOCUMENTS

| | | |
|---|---|---|
| EP | 1 821 313 A1 | 2/2006 |
| WO | 2005/013284 A1 | 2/2005 |

OTHER PUBLICATIONS

Extended European Search Report dated Dec. 3, 2021 issued in the corresponding European Patent Application No. 21180467.9.

* cited by examiner

*Primary Examiner* — Peguy Jean Pierre
(74) *Attorney, Agent, or Firm* — Rimon P.C.

(57) ABSTRACT

A sampling switch circuit, comprising an input node, connected to receive an input voltage signal, a sampling transistor comprising a gate terminal, a source terminal and a drain terminal, the source terminal connected to the input node, a hold-control node connected to receive a hold-control voltage signal, an output node connected to the drain terminal of the sampling transistor, a buffer circuit having a buffer input connected to the input node and a buffer output connected to a track-control node, the buffer circuit configured to provide a track-control voltage signal at the track-control node dependent on the input voltage signal and switching circuitry configured to connect the gate terminal of the sampling transistor to the track-control node or to the hold-control node in dependence upon a clock signal.

16 Claims, 13 Drawing Sheets

SAMPLING SWITCH CIRCUITS

CROSS-REFERENCE OF RELATED APPLICATIONS

This application claims the benefit of European Patent Application No. 21180467.9, filed on Jun. 18, 2021, the entire disclosure of which Application is incorporated by reference herein.

The present invention relates to sampling switch circuits and circuitry, which may be referred to as sampling circuitry. Sampling switch circuits in line with the present invention may be referred to as sample-and-hold circuits or sample and hold switch circuits.

Voltage mode and current mode sampling is known in general terms, and a sample-and-hold circuit may be considered an example of a voltage mode sampling circuit. A previously-considered bootstrapping method will now be explored by way of introduction.

In a typical voltage mode sampler, a sampling transistor such as a field-effect transistor (FET) acts as a simple switch which is ON during a sampling (tracking) phase and is OFF during a hold phase. The on-resistance of the device (sampling transistor) depends on the input voltage (e.g. gate-source voltage in the case of a FET) which in turn creates harmonic distortion—i.e. input-dependent distortion. Where the voltage mode sampler is at the front end of an analogue-to-digital converter (ADC), the harmonic distortion may limit the dynamic range of the ADC.

The bootstrap circuit first appeared under the form of a passive level shifter which worked in a continuous mode to provide a proportional-to-input gate voltage. See for example M. Kikushi and M. Takeda, "Distortionless FET switching circuit" U.S. Pat. No. 3,942,039. Later, developments were made to reduce the continuous power dissipation (with the increasing number of implemented switches) and the voltage headroom (with reduction in supply voltages), leading to the widely used bootstrap topology, for example as explored in M. Dessouky and A. Kaiser, "Very low-voltage digital audio TR modulator with 88-dB dynamic range using local switch bootstrapping," IEEE J. Solid-State Circuits, vol. 36, pp. 349-355, March 2001.

A bootstrapping circuit may be used to provide or apply a constant voltage over the gate-source of the switch (during the sampling or tracking phase) which is—at least, theoretically—independent of the input signal. This minimizes the input-dependant on-resistance variations of the sampling switch.

The role of the bootstrapping circuit is to maintain a continuous on-resistance of switches by maintaining a constant gate-source voltage Vgs. A previously-considered bootstrapping method will now be explored by way of introduction.

FIG. 1 is a schematic diagram of a sampling switch circuit 1, useful for an overall understanding of the bootstrapping concept. An input signal $V_{IN}$ is applied to the source (source terminal) of the sampling switch $M_S$. A voltage source $V_0$ (e.g. a battery) is then connected between the source and the gate (gate terminal), via a clock-controlled switch, so that the voltage $V_0+V_{IN}$ is applied to the gate of the sampling switch $M_S$ during the tracking phase where $V_0$ is a constant voltage. The gate is separately connected via another clock-controlled switch to ground (ground supply voltage). A sampling capacitor $C_S$ is connected to the drain (drain terminal) of the sampling switch $M_S$, which serves as the output node of the circuit 1, where an output signal $V_{OUT}$ is produced. The sampling capacitor $C_S$ is connected between the drain and ground.

Normally, $V_0=V_{DD}$ as shown, where $V_{DD}$ is the supply voltage, and this allows a maximum possible gate-source voltage over the device $M_S$ which creates the minimum on-resistance. In FIG. 1, CLK is the sampling clock (clock signal) with a frequency fs.

The operation of the circuit 1 is as follows. When CLK is high (and –CLK is low), the gate of the sampling switch $M_S$ is connected to ground (ground supply voltage). The terms "high" and "low" may refer to voltage levels such as digital voltage levels, for example to $V_{DD}$ and GND (0 V) voltage levels, respectively. The transistor $M_S$ is thus OFF and the circuit 1 is in a hold phase where the sampled value (voltage) on the sampling capacitor $C_S$ is held. When CLK is low (–CLK is high), $V_{IN}+V_{DD}$ is applied to the gate of the switch. The transistor $M_S$ is thus ON and the circuit 1 now enters tracking mode and the voltage across the sampling capacitor $C_S$ tracks the input signal $V_{IN}$. The gate-source voltage in the tracking mode is thus $V_{IN}+V_{DD}-V_{IN}=V_{DD}$, i.e. independent of the input signal $V_{IN}$.

FIG. 2 shows a previously-considered bootstrapped circuit 10, as a detailed implementation of circuit 1, in which the voltage source $V_0$ (in other words, the battery in FIG. 1) is realized with a fairly large capacitor $C_B$.

The operation of the circuit 10 is as follows.

When the sampling clock is high (i.e., CLK=high), transistors $M_5$ and $M_{5t}$ are ON which brings down the voltage on node G (i.e. at the gate of the sampling switch $M_S$) to ground. This turns OFF the sampling switch, $M_S$, and the hold phase starts in which the sampled value on the sampling capacitor $C_S$ is held. During this phase (i.e., the hold phase), transistors $M_2$ and $M_7$ are also OFF. The clock signal "–CLK" (which is an inverted version of the clock signal CLK) is low (i.e., –CLK=low). This turns OFF the transistor $M_6$ and turns ON transistor $M_8$. This brings up a voltage at the node Z to the supply, i.e., $V_{DD}$. Since node Z is now connected to $V_{DD}$, transistor $M_4$ is OFF. At the same time, since the voltage at node G is at ground (i.e. has a ground supply voltage), transistor $M_3$ is ON. The transistor $M_1$ is also ON (due to CLK=high). In this case, the capacitor $C_B$ is connected to ground (GND) at its bottom plate and connected to $V_{DD}$ at its top plate. This is thus also called the precharge phase, since as the sample is held on the sampling capacitor $C_S$, the capacitor $C_B$ is precharged to store the voltage $V_{DD}$.

When the sampling clock is low (i.e., CLK=low), the transistors $M_{5,5t}$ are switched OFF and thus node G is disconnected from ground. Transistor $M_8$ is quickly turned OFF and transistor $M_6$ is quickly turned ON (–CLK=high) and connects node X (whose voltage level is at ground at the beginning of this phase) to node Z which in turn brings down the voltage on node Z from $V_{DD}$ to ground. This turns on the transistor $M_4$ and connects node Y to node G. In this case, the voltage on node G starts to rise (since node Y was charged to $V_{DD}$ during the precharge/hold phase). While the voltage on node G is rising, the transistors $M_2$ and $M_7$ start to conduct (in other words, they turn ON). This raises the voltage at node Z and at node X towards the voltage of the input signal, $V_{IN}$. At this point, the voltage at node Y is raised to $V_{DD}+V_{IN}$ (since $V_{DD}$ is the initial voltage over the capacitor $C_B$). This voltage ($V_{DD}+V_{IN}$) is transferred to node G (i.e., the gate of sampling switch, $M_S$). In this case, the gate-source voltage of this switch is $V_{DD}+V_{IN}-V_{IN}=V_{DD}$ which is constant and independent of the input signal $V_{IN}$. As mentioned before, this phase is called the tracking phase, in which the sampling switch $M_S$ is ON and the voltage across the sampling capacitor $C_S$ tracks the input signal $V_{IN}$.

As an aside, in FIG. 2 the voltages across terminals of all switches (transistors) at all times are equal or less than the supply voltage, $V_{DD}$. This guarantees stress-free operation of the transistor circuitry.

It is desirable to provide sampling switch circuits which have improved performance for example at higher speeds of operation. It is desirable to provide improved sampling switch circuits which may be used as a voltage mode sampler front-end for an ADC, e.g. for use in direct RF applications.

According to an embodiment of a first aspect of the present invention, there is provided a sampling switch circuit, comprising an input node, connected to receive an input voltage signal, a sampling transistor comprising a gate terminal, a source terminal and a drain terminal, the source terminal connected to the input node, a hold-control node connected to receive a hold-control voltage signal, an output node connected to the drain terminal of the sampling transistor, a buffer circuit having a buffer input connected (directly or indirectly) to the input node and a buffer output connected to a track-control node, the buffer circuit configured to provide a track-control voltage signal at the track-control node dependent on the input voltage signal, and switching circuitry configured to connect the gate terminal of the sampling transistor to the track-control node or to the hold-control node in dependence upon a clock signal.

Such a sampling switch circuit may be referred to, for example, as a sampling circuit, a sampler circuit, a sampler front-end circuit, an ADC front-end circuit, a sample-and-hold circuit or a sample and hold switch circuit.

It will be understood that connections herein may be circuit connections, for example conductive connections (and may involve DC connections and/or AC connections via a capacitor). Voltages provided at a node may be applied at or generated at that node.

The sampling switch circuit may comprise a potential divider circuit connected to the input node and the buffer input to provide a buffer-input voltage signal dependent on the input voltage signal at the buffer input.

The potential divider circuit may be configured to maintain the buffer-input voltage signal at the buffer input, optionally as a continuous signal and optionally independently of the clock signal.

The potential divider circuit may be connected to a sample node to provide a sample voltage signal dependent on the input voltage signal at the sample node. The source terminal of the sampling transistor may be connected to the sample node and may be connected to the input node via the sample node.

The potential divider circuit may be configured such that the track-control voltage signal and the sample voltage signal have DC components with different voltage levels from one another.

Optionally, the potential divider circuit may comprise a first impedance connected between the input node and the buffer input and a second impedance connected between the buffer input and a first reference node.

Optionally, or additionally, the potential divider circuit may comprise a third impedance connected between the input node and the sample node and a fourth impedance connected between the sample node and a second reference node. The potential divider circuit may comprise the third impedance and the fourth impedance but not the first impedance or the second impedance.

The first reference node may be connected to receive a first DC reference voltage signal and the second reference node may be connected to receive a second DC reference voltage signal.

The first reference voltage signal and/or the second reference voltage signal may be a DC voltage signal. The first reference node may be connected to a voltage supply node, for example having a voltage level different from (higher than) that of a $V_{DD}$ supply node.

The second reference node may be connected to a voltage supply node, such as a ground supply node or a voltage supply node having a voltage level different from that of a ground supply node.

The potential divider circuit may be at least one of: an impedance circuit; a resistor circuit; a resistor network; a passive circuit; and a linear circuit. A resistor circuit/resistor network may comprise resistors (amongst other components) or the components thereof may all be resistors.

The first impedance may be implemented as a resistor or as a resistor connected in series with a capacitor, or as a resistor connected in parallel with a capacitor, or as a capacitor connected in series with a parallel combination of impedances, the parallel combination of impedances comprising a resistor connected in parallel with a capacitor. Optionally or additionally, the second impedance may be implemented as a resistor, or as a resistor connected in series with an inductor. Further optionally or additionally, the third impedance may be implemented as a resistor, or as a resistor connected in parallel with a capacitor. Further optionally or additionally, the fourth impedance may be implemented as a resistor, or as a resistor connected in series with a parallel combination of impedances, that parallel combination of impedances comprising a resistor connected in parallel with a capacitor, optionally wherein that parallel combination of impedances is connected to the second reference node.

The first to fourth impedances may have impedance values configured such that an input impedance at the input node is substantially defined by the third and fourth impedances. The first to fourth impedances may have impedance values configured such that an input impedance at the input node is substantially dominated by the third and fourth impedances, or substantially equal to the third and fourth impedances.

A sum of the impedance values of the first and second impedances may be X times bigger than a sum of the impedance values of the third and fourth impedances, where $X \geq 2$, and optionally where $X \geq 5$, for <−20 dB in $S_{11}$. Similarly, a sum of the impedance values of the first and second impedances may be bigger than a sum of the impedance values of the third and fourth impedances such that the equivalent resistance of the first and second impedances in parallel with the third and fourth impedances is within Y percent of the sum of the impedance values of the third and fourth impedances, where $0 \leq Y \leq 20$, and optionally where $0 \leq Y \leq 10$ or $0 \leq Y \leq 5$.

The switching circuit may be configured such that, when the gate terminal of the sampling transistor is connected to the track-control node, the sampling transistor is ON and a voltage at the drain terminal of the sampling transistor and/or the output node tracks a voltage at the source terminal of the sampling transistor.

The sampling switch circuit may comprise a sampling capacitor connected to the output node, optionally between the output node and a ground supply node. Such a sampling capacitor may serve to hold a voltage level at the output node.

When the gate terminal of the sampling transistor is connected to the hold-control node, the sampling transistor may be OFF and a voltage at the drain terminal of the sampling transistor and/or at the output node may be at least temporarily maintained or held.

The hold-control voltage signal may have a hold-control DC component, and a difference between voltage levels of the hold-control DC component and the sample DC component may be less than the threshold voltage of the sampling transistor. The difference between voltage levels of the hold-control DC component and the sample DC component may be sufficient to turn the sample transistor OFF when the gate terminal is connected to the hold-control node. The hold-control voltage signal may be a DC voltage signal. The hold-control voltage signal may be a ground supply signal. The hold-control node may be connected to a voltage supply node such as a ground supply node. The hold-control voltage signal may be a DC voltage signal. The hold-control voltage signal may be a constant voltage signal or a constant DC voltage signal.

The buffer circuit may comprise a single buffer connected between its buffer input and its buffer output or may comprise a plurality of buffers connected together between its buffer input and its buffer output. The buffer circuit may comprise a plurality of buffers and those buffers may be connected together in series between the buffer input and the buffer output. The single buffer or at least one of the plurality of buffers may comprise a source follower. The single buffer or at least one of the plurality of buffers may comprise an operational amplifier.

The buffer circuit may be a first buffer circuit. The sampling switch circuit may comprise a second buffer circuit. The second buffer circuit may have a buffer input connected to the input node, optionally via the sample node, and may have a buffer output connected to the source terminal of the sampling transistor and configured to provide a voltage signal at the source terminal of the sampling transistor dependent on the input voltage signal.

The second buffer circuit may comprise a single buffer connected between its buffer input and its buffer output. The second buffer circuit may comprise a plurality of buffers connected together between its buffer input and its buffer output. The second buffer circuit may comprise a plurality of buffers. Those buffers may be connected together in series between the buffer input and the buffer output of the second buffer circuit. The single buffer or at least one of the plurality of buffers of the second buffer circuit may comprise a source follower. The single buffer or at least one of the plurality of buffers of the second buffer circuit may comprise an operational amplifier.

The first buffer circuit may generate a first buffer delay between its buffer input and its buffer output. The second buffer circuit may generate a second buffer delay between its buffer input and its buffer output. The first and second buffer circuits may be configured such that the second buffer delay is substantially the same as the first buffer delay and/or such that when the gate terminal of the sampling transistor is connected to the track-control node a voltage signal provided at the gate terminal of the sampling transistor is substantially in phase with a voltage signal provided at the source terminal of the sampling transistor.

The second buffer circuit may be substantially the same as the first buffer circuit.

The switching circuitry may comprise a first switch connected between the gate terminal of the sampling transistor and the track-control node, and a second switch connected between the gate terminal of the sampling transistor and the hold-control node. The first and second switches may be implemented with transistors.

The first switch may be connected in series with a resistance between the gate terminal of the sampling transistor and the track-control node, optionally wherein that resistance is implemented with one or more transistors. The second switch may be connected in series with a resistance between the gate terminal of the sampling transistor and the hold-control node, optionally wherein that resistance is implemented with one or more transistors.

The second switch may be connected in series with a resistance between the gate terminal of the sampling transistor and the hold-control node, optionally wherein that resistance is implemented with one or more transistors. The first and second switches may be connected to be controlled by the clock signal so that when one of the switches is ON the other of them is OFF.

The sampling switch circuit may be configured to have multiple channels. Each channel may comprise its own sampling transistor, output node, switching circuitry and clock signal. For each channel, the source terminal of the sampling transistor may be connected to the input node, the output node may be connected to the drain terminal of the sampling transistor, and the switching circuitry may be configured to connect the gate terminal of the sampling transistor to the track-control node or to the hold-control node in dependence upon the clock signal. Such clock signals may form a set of time-interleaved clock signals.

Each channel may comprise its own buffer circuit. Each channel may comprise its own first buffer circuit and second buffer circuit.

According to an embodiment of a second aspect of the present invention, there is provided an analogue-to-digital converter, comprising the sampling switch circuit according to the aforementioned first aspect of the present invention.

According to an embodiment of a second aspect of the present invention, there is provided integrated circuitry, such an IC chip, comprising the sampling switch circuit according to the aforementioned first aspect of the present invention, or the analogue-to-digital converter according to the aforementioned second aspect of the present invention.

Reference will now be made, by way of example, to the accompanying drawings, of which:

FIG. 1, as mentioned above, shows a schematic diagram of a previously-considered sampling switch circuit;

FIG. 2, as mentioned above, shows a previously-considered bootstrapped circuit, as a detailed implementation of the FIG. 1 circuit;

Embodiments of the present invention seek to address the above problems.

Figure 1:
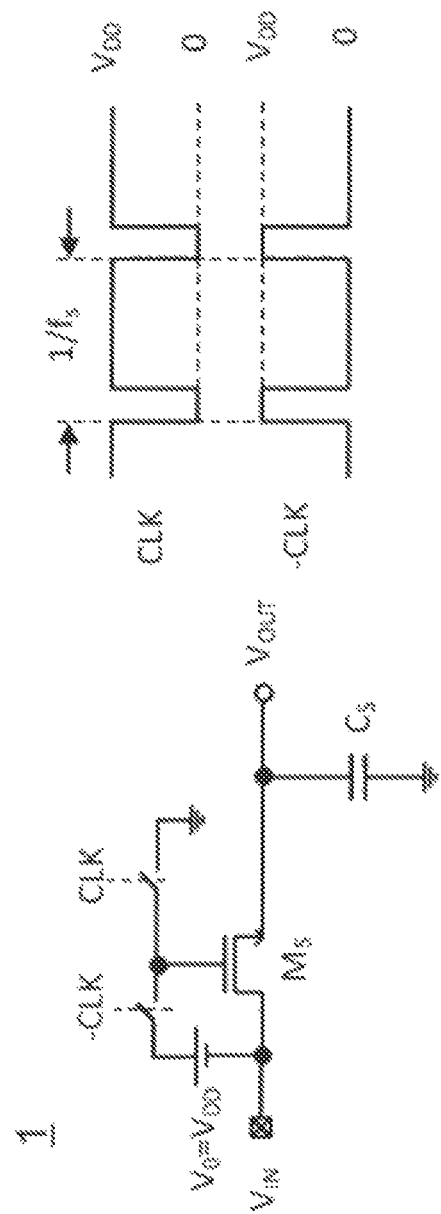
Figure 2:
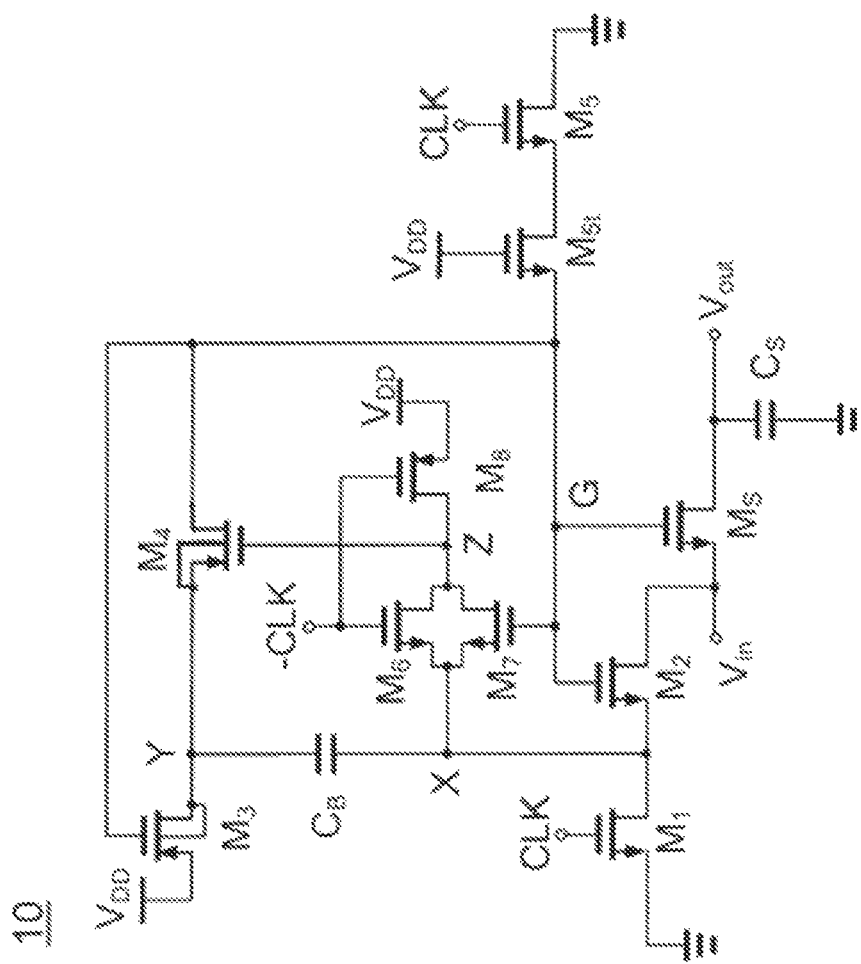

In particular, by way of overview and recalling the discussion of FIG. 2, the precharge phase is rendered unnecessary by removing the bulky capacitor $C_B$ from the switching path. By removing the precharge phase, the maximum operation frequency of the clocking circuit is boosted considerably. Further, the state of devices (transistors) is rendered dependent either on clock signals or the input voltage, rather than on the voltage at the gate of the sampling device $M_S$. The total capacitance at the gate of the sampling switch $M_S$ is also reduced (e.g. by reducing the number of devices—transistors—connected to that node), which enables the tracking time constant to be enhanced (i.e. reduced).

Figure 3:
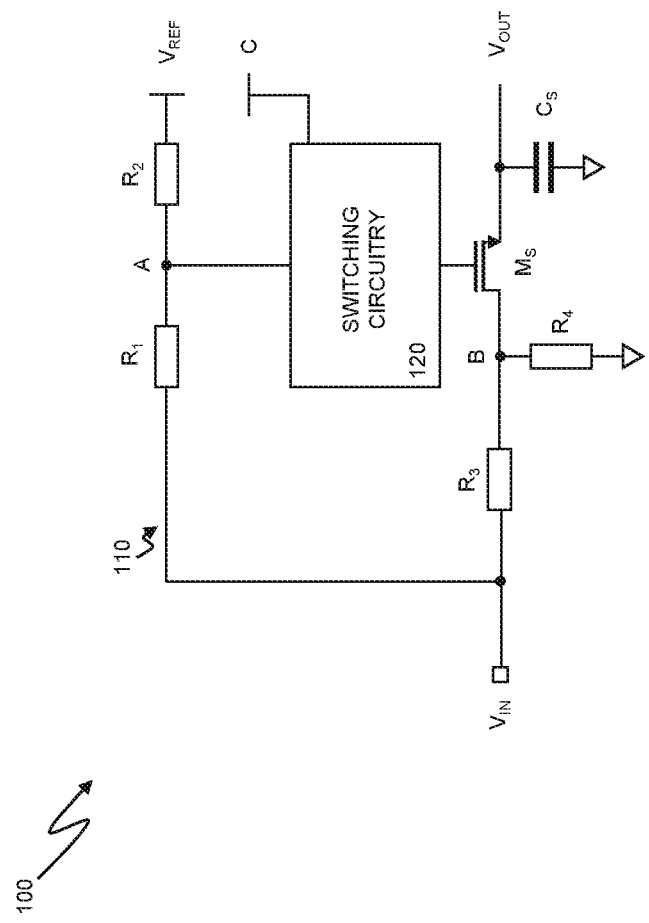
FIG. 3 shows a schematic diagram of a sampling switch circuit useful for understanding the present invention.

FIG. 3 is a schematic diagram of a sampling switch circuit 100 useful for understanding the present invention. The sampling switch circuit 100 may be referred to for example as a sampling circuit, a sampler circuit, a sampler front-end circuit, an ADC front-end circuit, a sample-and-hold circuit or a sample and hold switch circuit. Compared to the sampling switch circuit 10, the need for the fairly large capacitor (i.e., $C_B$) has been removed and the transistor count has been reduced.

The sampling switch circuit 100 comprises an input node (marked as $V_{IN}$), a sampling transistor (sampling switch) $M_S$, a potential divider circuit 110, a track-control node (node A), a sample node (node B), a hold-control node (node C), switching circuitry 120 and an output node (marked as $V_{OUT}$).

The input node is connected to receive an input voltage signal $V_{IN}$ to be sampled. The sampling transistor $M_S$ comprises a gate terminal, a source terminal and a drain terminal, the source terminal connected to the input node. The potential divider circuit 110 is connected to the input node and the track-control node to provide a track-control voltage signal dependent on the input voltage signal $V_{IN}$ at the track-control node. The hold-control node is connected to receive a hold-control voltage signal, which in this example is a DC voltage signal (a DC reference voltage or DC reference voltage signal). As a convenient example, the hold-control voltage signal will be taken forwards as being a ground supply voltage signal. The switching circuitry 120 is configured to connect the gate terminal of the sampling transistor (either) to the track-control node or to the hold-control node in dependence upon a (sampling) clock signal CLK (not shown).

The potential divider circuit 110 comprises resistors $R_1$ to $R_4$. The resistor $R_1$ is connected between the input node and node A. The resistor $R_2$ is connected between node A and a first reference node (marked as $V_{REF}$) which is connected to receive a first reference voltage signal $V_{REF}$, which in this case is a DC (supply) voltage signal (a DC reference voltage or DC reference voltage signal) which may be assumed to be higher in voltage level than the (core) supply voltage $V_{DD}$. The third resistor $R_3$ is connected between the input node and node B, which is connected to the source terminal of the sampling transistor $M_S$. The fourth resistor $R_4$ is connected between node B and a second reference node which is connected to receive a second reference signal, which in this case is a ground supply voltage signal.

Thus, the potential divider circuit 110 is connected to the track-control node to provide a track-control voltage signal defined at least by the input voltage signal $V_{IN}$ and by the potential divider circuit 110. Similarly, the potential divider circuit 110 is connected to the sample node to provide a sample voltage signal at the sample node defined at least by the input voltage signal $V_{IN}$ and by the potential divider circuit 110, the source terminal of the sampling transistor $M_S$ connected to the sample node and connected to the input node via the sample node.

The output node is connected to the drain terminal of the sampling transistor $M_S$. A sampling capacitor $C_S$ is connected between the output node and ground.

Figure 3A:
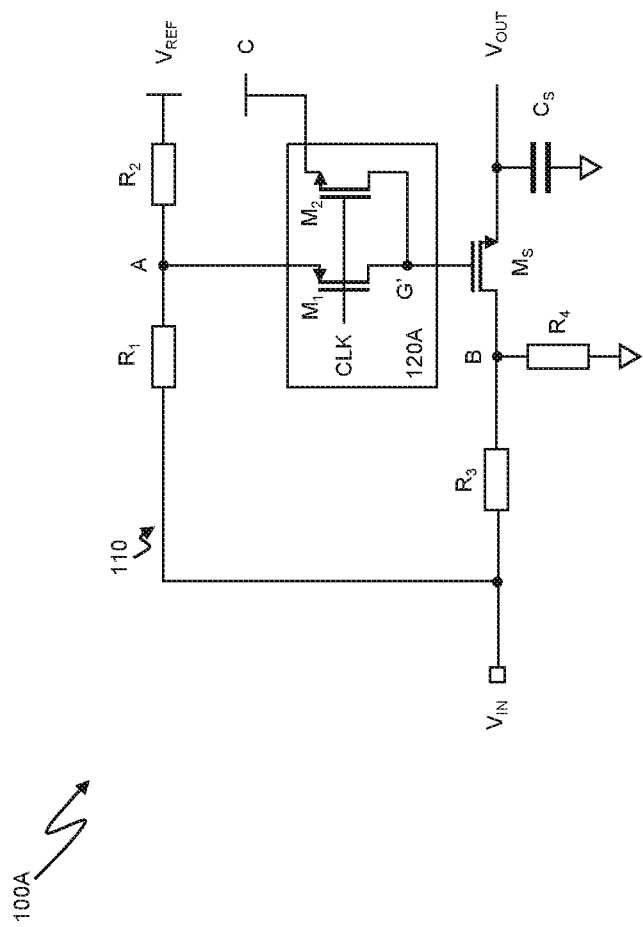
FIG. 3A shows a schematic diagram of an alternative circuit configuration of FIG. 3.

FIG. 3A is a schematic diagram of a sampling switch circuit 100A, as an example implementation of the sampling switch circuit 100 of FIG. 3 and useful for understanding the operation of both circuits. The sampling switch circuit 100A differs from the sampling switch circuit 100 in that one possible configuration of the switching circuitry 120 is shown as switching circuitry 120A.

In FIG. 3A, the switching circuitry 120A comprises transistors $M_1$ and $M_2$ which act as switches of the switching circuitry and are controlled at their gate terminals by the clock signal CLK. $M_1$ is connected with its channel between the gate terminal of $M_S$ (marked as node G') and the track-control node (node A), and $M_2$ is connected with its channel between node G' and the hold-control node (node C).

Transistors $M_S$, $M_1$ and $M_2$ are shown as FETs, for example MOSFETS, with $M_S$ and $M_2$ being NMOS (n-channel) devices and $M_1$ being a PMOS (p-channel) device. Thus, $M_1$ connects node A to the gate node G' of $M_S$ when CLK is low and turns ON the sampling switch $M_S$ (as explained below), while $M_2$ connects node C to the gate node G' of $M_S$ and turns OFF the sampling switch $M_S$ when CLK is high.

It will be appreciated that other possible configurations of the switching circuitry 120 exist and that operate in a similar way as switching circuitry 120A. Other variations of switching circuitry 120 can be seen, for example, in FIGS. 9 and 10 as switching circuitry 120B and 120C respectively.

In order to better appreciate the general operation of the circuits 100 and 100A (as well as embodiments described later herein), operation of the circuit 100A will be considered in more detail. The operation will be described in relation to the configuration shown in circuit 100A for simplicity, however it will be appreciated that similar considerations apply to the variations of switching circuitry 120A mentioned above.

Circuit 100A operates in two phases, a sampling phase (or tracking phase) and a hold phase.

During the sampling phase, the switching circuitry 120A connects the gate terminal of the sampling transistor $M_S$ to the track-control node (node A) dependent on the clock signal CLK (the clock signal defining the start of the sampling phase). The potential divider circuit 110 provides a voltage at the track-control node ($V_A$) and the sample node ($V_B$), where the voltages at each node are dependent on the values of the impedances of the potential divider circuit, the reference voltage signal $V_{REF}$, and the voltage signal $V_{IN}$ provided at the input.

In more detail, the potential divider circuit 110 is connected to the track-control node (node A) to provide the track-control voltage signal with a track-control AC component defined at least by the input voltage signal $V_{IN}$ and a track-control DC component defined at least by the potential divider circuit 110. Similarly, the potential divider circuit 110 is connected to the sample node (node B) to provide a sample voltage signal at the sample node (node B) which has a sample AC component defined at least by the input voltage signal $V_{IN}$ and a sample DC component defined at least by the potential divider circuit 110, the source terminal of the sampling transistor $M_S$ connected to the sample node (node B) and connected to the input node via the sample node (node B).

Note that there is a component of the input voltage signal $V_{IN}$ in the sample voltage signal at the sample node (node B) and in the track-control voltage signal at the track-control node (node A), enabling the gate-source voltage to be constant and independent of the input signal $V_{IN}$. Additionally, by virtue of the potential divider circuit 110, the gate-source voltage may be set at a level which will cause the sampling transistor to be ON during the sampling phase.

During the hold phase, the switching circuitry 120A connects the gate terminal of the sampling transistor to the hold-control node (node C) dependent on the clock signal (a subsequent clock cycle defining the start of the hold phase). The voltage present at the hold control node (a ground supply voltage signal, in the running example) is capable of turning OFF the sampling transistor and the voltage at the drain terminal of the sampling transistor may thus be at least temporarily maintained or held by virtue of the sampling capacitor $C_S$.

It should be noted that it is assumed in the above that the input signal $V_{IN}$ is to be DC-connected at the input node, so that it applies both DC and AC components. It would however be possible to AC connect the input signal $V_{IN}$ at the input node (i.e. via a coupling capacitor).

The circuit 100 of FIG. 3 and circuit 100A of FIG. 3A also have advantages from the point of view of input impedance matching, where $R_3$ and $R_4$ can be designed so that the impedance seen at the input can match that of a connected circuit. The person skilled in the art would be familiar with the concept of impedance matching and could set the impedance values of the potential divider accordingly.

In particular, the potential divider circuit 100, implemented as a resistive network or resistor circuit, offers an equivalent input impedance which can be utilized for the sake of impedance matching in high-speed applications.

An interesting aspect of the voltage division between $R_3$ and $R_4$ relates to the reflection coefficient (i.e., $S_{11}$). If $R_4$ is much larger than $R_3$, then most of the input power ($V_{IN}$) will pass through the sampling switch $M_S$.

Figure 4:
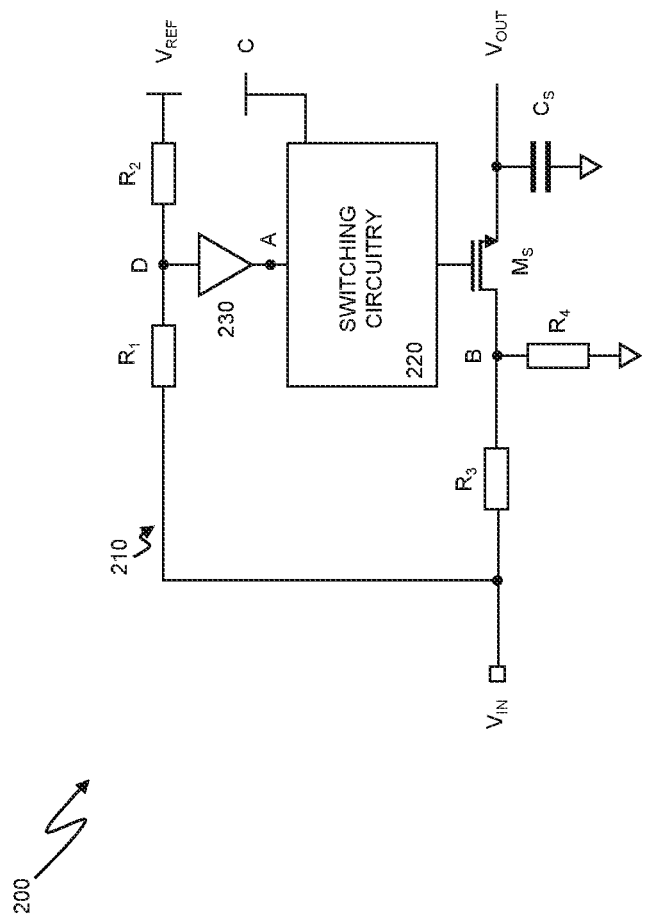
FIG. 4 shows a schematic diagram of a circuit configuration embodying the present invention.

FIG. 4 is a schematic diagram of a sampling switch circuit 200, embodying the present invention. As before, the sampling switch circuit 200 may be referred to for example as a sampling circuit, a sampler circuit, a sampler front-end circuit, an ADC front-end circuit, a sample-and-hold circuit or a sample and hold switch circuit.

In overview, the sampling switch circuit 200 is similar to the sampling switch circuit 100, with a main difference being the presence of a buffer circuit 230 between the potential divider circuit and the track-control node (node A).

In detail, the circuit 200 comprises an input node, connected to receive an input voltage signal $V_{IN}$, a sampling transistor $M_S$ comprising a gate terminal, a source terminal and a drain terminal, the source terminal connected to the input node, a hold-control node (node C) connected to receive a hold-control voltage signal, an output node $V_{OUT}$ connected to the drain terminal of the sampling transistor, the buffer circuit 230 having a buffer input (node D) connected to the input node $V_{IN}$ and a buffer output connected to a track-control node (node A) and switching circuitry 220 configured to connect the gate terminal of the sampling transistor to the track-control node or to the hold-control node in dependence upon a clock signal. The buffer circuit 230 is configured to provide a track-control voltage signal at the track-control node dependent on the input voltage signal.

The circuit 200 also comprises a potential divider circuit 210 which is similar to the potential divider circuit 110. The potential divider circuit 210 is connected to the input node and the buffer input to provide a buffer-input voltage signal dependent on the input voltage signal at the buffer input (node D). The potential divider circuit 210 is also connected to a sample node (node B) to provide a sample voltage signal dependent on the input voltage signal at the sample node. The source terminal of the sampling transistor is connected to the sample node and connected to the input node via the sample node.

The potential divider circuit 210 is configured such that the track-control voltage signal and the sample voltage signal have DC components with different voltage levels from one another.

Similar to the potential divider circuit 110, the potential divider circuit 210 comprises a first impedance $R_1$ connected between the input node (node $V_{IN}$) and the buffer input (node D), a second impedance $R_2$ connected between the buffer input (node D) and a first reference node $V_{REF}$, a third impedance $R_3$ connected between the input node (node $V_{IN}$) and the sample node (node B) and a fourth impedance $R_4$ connected between the sample node (node B) and a second reference node.

The first reference node may be connected to receive a first DC reference voltage signal and the second reference node may be connected to receive a second DC reference voltage signal. The first DC reference voltage signal may be for example the (core) supply voltage signal $V_{DD}$. The second DC reference voltage signal may be for example the ground supply voltage signal GND.

In a particular configuration, the first impedance $R_1$ may be implemented as a resistor or as a resistor connected in series with a capacitor, or as a resistor connected in parallel with a capacitor, or as a capacitor connected in series with a parallel combination of impedances, the parallel combination of impedances comprising a resistor connected in parallel with a capacitor. The second impedance $R_2$ may be implemented as a resistor, or as a resistor connected in series with an inductor. The third impedance $R_3$ may be implemented as a resistor, or as a resistor connected in parallel with a capacitor. The fourth impedance $R_4$ may be implemented as a resistor, or as a resistor connected in series with a parallel combination of impedances, that parallel combination of impedances comprising a resistor connected in parallel with a capacitor, optionally wherein that parallel combination of impedances is connected to the second reference node.

The switching circuitry 220 may be the same as the switching circuitry 120 or 120A as described earlier, or switching circuitry 120B or 120C as described later in relation to FIGS. 9 and 10. Accordingly, duplicate description will be omitted.

The buffer circuit 230 is configured to provide the track-control voltage signal at the buffer output and thus at the track-control node (node A), based on the voltage signal at the buffer input (node D) and thus based on the input voltage signal at the input node $V_{IN}$. The buffer circuit 230 effectively isolates a voltage signal present at the input of the buffer circuit (node D) from the voltage signal present at the output of the buffer circuit (i.e. at node A), and in particular from whatever current the switching circuitry 220 may be provided with from the buffer circuit 230. Effectively, the buffer circuit 230 has a relatively high input impedance and a relatively low output impedance.

Additionally, in some arrangements, the buffer circuit 230 may provide a shift in DC voltage level between the voltage signal present at the input of the buffer circuit (node D) and the voltage signal present at the output of the buffer circuit (i.e. at node A), as commented on later.

Figure 4A:
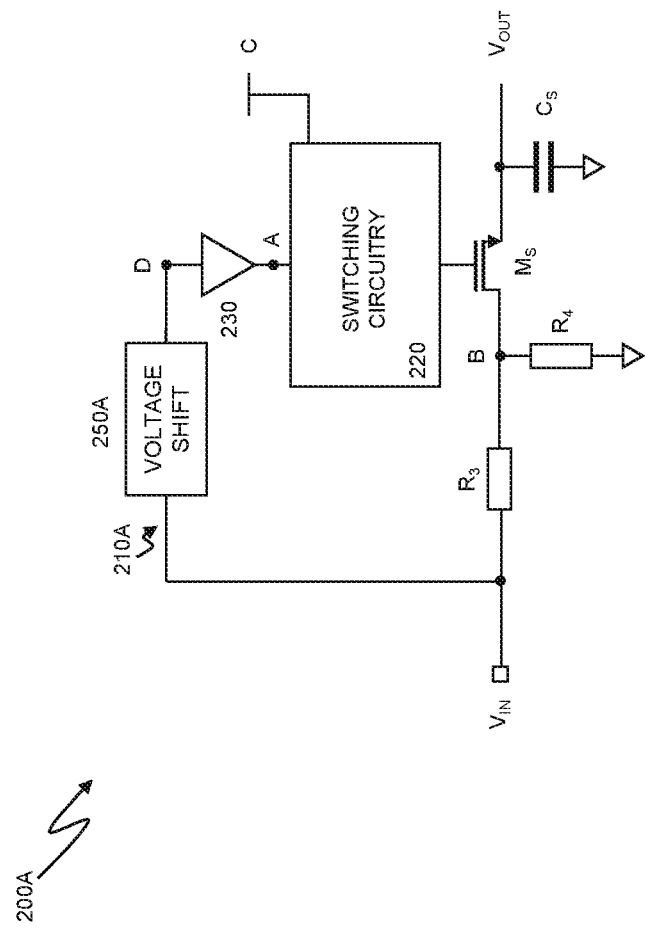
FIG. 4A shows a schematic diagram of an alternative circuit configuration of FIG. 4.

FIG. 4A is a schematic diagram of a sampling switch circuit 200A, as an example modification of the sampling switch circuit 200 of FIG. 4. The sampling switch circuit 200A differs from the sampling switch circuit 200 in that a voltage shift circuit 250A is provided in place of the upper branch of FIG. 4, comprising impedances $R_1$ and $R_2$, as well as the first reference node $V_{REF}$. In effect, potential divider circuit 210 has been replaced with circuit 210A which comprises the voltage shift circuit 250A, $R_3$, $R_4$ and the second reference node.

The voltage shift circuit 250A can be considered to shift (increase, or in some cases decrease) the DC voltage level at the buffer input (node D) relative to that at the input node $V_{IN}$, similar to the DC shift provided by the potential divider circuits 110 and 210. The skilled person would be aware of alternatives to shifting (increasing or decreasing) a voltage level at a particular node and could apply alternatives at the voltage shift circuit 250A to achieve the same effect.

A number of benefits arise with the use of the buffer circuit 230 and will be described with reference to FIG. 4.

Firstly, the isolation of the voltage signal present at the input of the buffer circuit (node D) from the voltage signal present at the output of the buffer circuit (node A) means that the input signal $V_{IN}$ is not used to drive the switching circuitry 220 directly as in FIG. 3. In circuit 100, the switching circuitry is driven by the voltage signal present in the top branch of the circuit. Impedances $R_1$ and $R_2$ of circuit 100 are typically chosen to have values small enough such that the current passing into the switching circuitry through the track-control node would be capable of driving the switching circuitry. This limits the size of the impedances $R_1$ and $R_2$. By placing a buffer between the input node and the track-control node (node A), the values of the impedances $R_1$ and $R_2$ can be relaxed (i.e. can be made much larger), since they are not necessary for the voltage-to-current conversion in order to drive the switching circuitry directly. Instead, the buffer output (by virtue of its own supply) provides sufficient current to drive the switching circuitry.

Since $R_1$ and $R_2$ are not required to provide a current capable of driving the switching circuitry directly, the first to fourth impedances may have impedance values configured such that an input impedance at the input node is substantially defined by (or dominated by) the third and fourth impedances. Put another way, the values of $R_1$ and $R_2$ can be made considerably larger than those of circuit 100 in order to reduce loading on the input signal by reducing the total current drawn, and to make design of the potential divider (in the sense of input impedance, and impedance matching, at the input node $V_{IN}$) dependent primarily on impedances $R_3$ and $R_4$. This is a consequence of providing larger values for $R_1$ and $R_2$, since the potential divider circuit from the input node appears as the upper branch in parallel with the lower branch.

The total impedance seen at the input is then effectively an equivalent impedance $R_{EQ}$ of the two parallel branches:

$$R_{EQ} = R_1 + R_2 \| (R_3 + R_4 \| R_{samp})$$

or $$1/R_{EQ} = 1/(R_1 + R_2) + 1/(R_3 + R_4 \| R_{samp})$$

where $R_{samp}$ is the equivalent impedance of the sampling switch $M_S$ and sampling capacitor $C_S$.

As $R_1$ and $R_2$ become large, $1/(R_1+R_2)$ tends to zero. That is, as $(R_1+R_2)$ tends to infinity (i.e. becoming very large):

$$1/R_{EQ} \approx 1/(R_3 + R_4 \| R_{samp})$$

The resultant impedance seen at the input node is approximately equal to the impedance formed by $R_3$ and $R_4$. The input impedance can then be designed based primarily on the values of $R_3$ and $R_4$ where $R_1$ and $R_2$ are suitably large. In some examples, a sum of the impedance values of the first and second impedances (i.e. $R_1+R_2$) may be X times bigger than a sum of the impedance values of the third and fourth impedances (i.e. $R_3+R_4$), where $X \geq 2$, and optionally where $X \geq 5$, for $< -20$ dB in $S_{11}$.

In another possible implementation, a sum of the impedance values of the first and second impedances may be bigger than a sum of the impedance values of the third and fourth impedances such that the equivalent resistance of the first and second impedances in parallel with the third and fourth impedances is within Y percent of the sum of the impedance values of the third and fourth impedances, where $0 \leq Y \leq 20$, and optionally where $0 \leq Y \leq 10$ or $0 \leq Y \leq 5$.

Secondly, since the sizing of the resistors $R_1$ and $R_2$ can be relaxed, the speed of the clock CLK used in the switching circuitry is no longer limited by the input signal. This in turn can increase the maximum operating frequency of the circuit and increase the circuit bandwidth.

Thirdly, the increased input impedance improves the impedance/reflection coefficient ($S_{11}$).

Finally, the design of circuit 100 does not provide protection of voltages exceeding safe-operating limits in the switching circuitry. Possible implementations of such a circuit may require a regulator to regulate the voltage at various parts of the circuit to maintain operation within the safe-operating limits.

The buffer circuit may comprise many types of buffer, each serving to provide the isolation effect described previously and having the high input impedance property. Examples of types of buffer will be described below but are not intended to be limiting. The person skilled in the art would understand that other buffer types may be employed.

Figure 5:
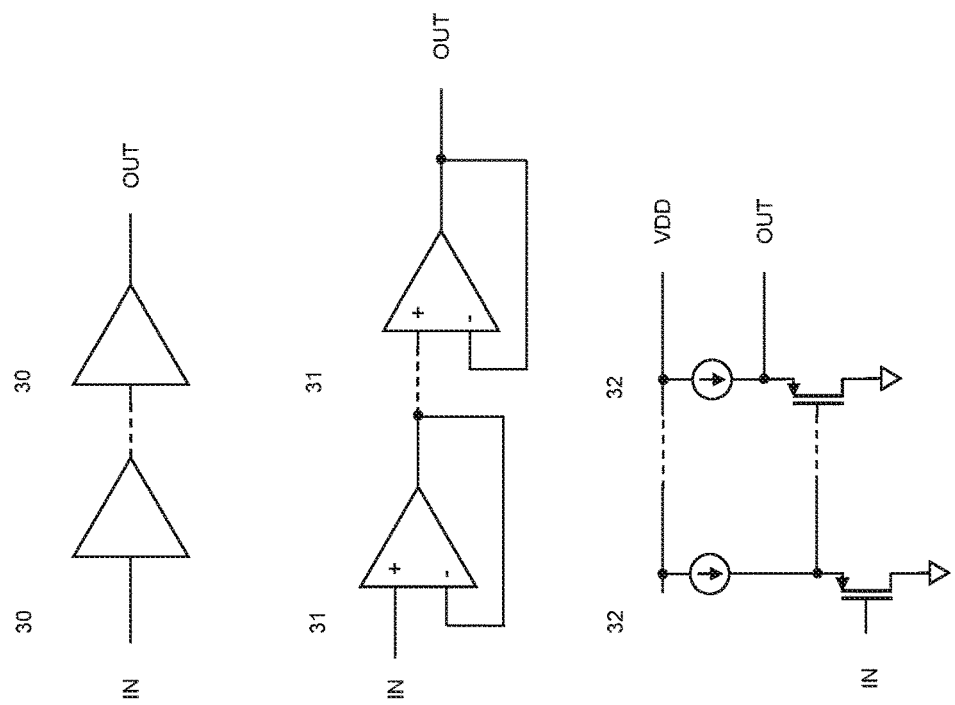
FIG. 5 shows examples of possible buffer circuit configurations.
Figure 5:
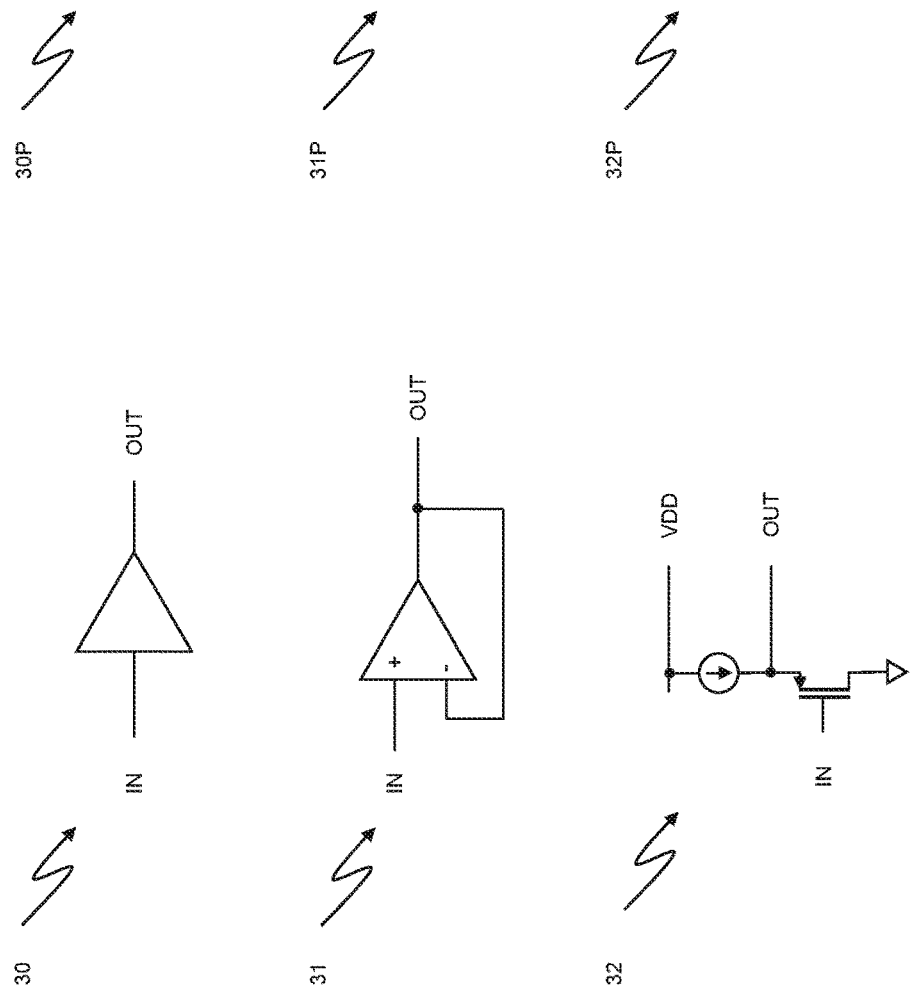

FIG. 5 shows examples of possible buffer circuit configurations. A generic representation of a buffer circuit is shown as buffer circuit 30. The buffer circuit may comprise a single buffer connected between its buffer input (IN) and its buffer output (OUT).

The buffer circuit may comprise an operational amplifier 31 and the operational amplifier may be configured to be a non-inverting operational amplifier as seen in FIG. 5.

The buffer circuit may comprise a source-follower type circuit 32, which may also be referred to as a common-drain type circuit or a common-collector type circuit, should an alternative type of transistor be used in its design.

In a configuration where the buffer circuit comprises a source-follower circuit (or, simply, a source follower), additional benefits may arise. The sampling transistor may have a variation in on-resistance due to process tolerances during manufacture. Since the source-follower comprises a transistor, these variations in on-resistance will also exist for the buffer. Therefore, variations across both the sampling transistor and the source-follower transistor may sum and cancel out the variation of the other, and reduce the total variation seen along the signal path. Further, such a buffer circuit may provide a DC shift (increase) between its buffer input (IN) and its buffer output (OUT), enabling the voltage level of the reference voltage signal $V_{REF}$ in the circuit 200 to be lower than for the circuit 100, and for example to adopt the same voltage level as the (core) supply voltage $V_{DD}$.

The buffer circuit may comprise a plurality of buffers connected together between its buffer input (IN) and its buffer output (OUT) as also shown in FIG. 5. A generic representation of a buffer circuit comprising a plurality of buffers connected together (in series) is shown as buffer circuit 30P. The buffers may be connected together in series between the buffer input and the buffer output, but may also be connected in parallel between the buffer input and the buffer output (e.g. to reduce the overall output impedance of the buffer circuit, therefore providing more drive strength and more bandwidth to the switching circuitry).

The person skilled in the art would understand that any number of buffers (i.e. two or more) may be connected together to form the buffer circuit, indicated by the dashed line between the first and second buffer of buffer circuit 30P.

The buffer circuit may comprise a plurality of operational-amplifiers shown as buffer circuit 31P or a plurality of source-follower type circuits shown as buffer circuit 32P. The buffer circuit may comprise an even number of inverting operational amplifiers to achieve a non-inverted buffer output (OUT) relative to the buffer input (IN).

Focussing on the buffer circuits 32 and 32P, the buffer circuit comprising a plurality of source-follower circuits may be described by the following equation:

$$V_{BUFFER\text{-}OUTPUT} = N^*V_{TH} + (RA/(RA+1))^*(V_{IN}+V_{REF})$$

where N is the number of buffers in the buffer circuit, $V_{TH}$ is the threshold voltage of the source-follower used in the buffer circuit and RA is ratio of the voltage shift circuit resistors ($R_1$ and $R_2$). $V_{BUFFER\text{-}OUTPUT}$ is the voltage seen at the buffer circuit output and is effectively the sum of the voltage at the buffer input $(RA/(RA+1))^*(V_{IN}+V_{REF})$ and n times the threshold voltage of the transistor of the source-follower circuit ($N^*V_{TH}$).

The above configurations of possible buffer circuits are not intended to be limiting, and the person skilled in the art would be aware of alternatives to the circuits described.

Figure 6:
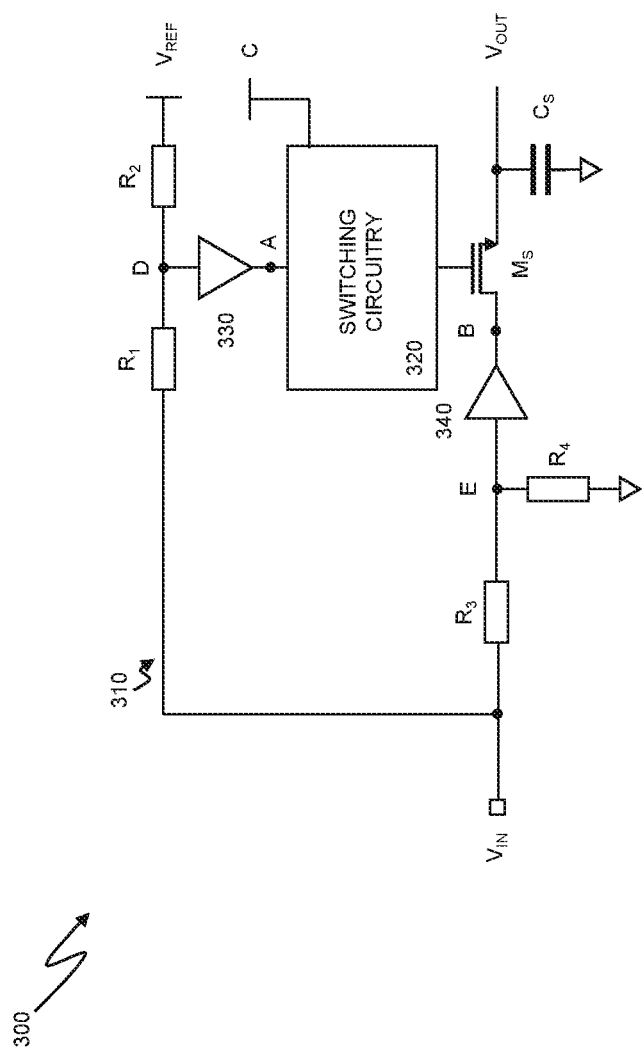
FIG. 6 shows a schematic diagram of an alternative circuit configuration including a second buffer circuit.

FIG. 6 is a schematic diagram of a sampling switch circuit 300, embodying the present invention. As before, the sampling switch circuit 300 may be referred to for example as a sampling circuit, a sampler circuit, a sampler front-end circuit, an ADC front-end circuit, a sample-and-hold circuit or a sample and hold switch circuit.

In overview, the sampling switch circuit 300 is similar to the sampling switch circuit 200, with a main difference being the presence of a second buffer circuit 340 between the potential divider circuit and the sampling node (node B).

The switching circuitry 320 may be the same as switching circuitry 120 or 120A as described earlier, or switching circuitry 120B or 120C as described later in relation to FIGS. 9 and 10. The potential divider circuit 310 may be the same as the potential divider circuit 110 as described earlier. The buffer circuit 330 may be the same as the buffer circuit 230 as described earlier. Accordingly, duplicate description will be omitted.

FIG. 6 shows the second buffer circuit 340 having a buffer input (node E) connected to the input node $V_{IN}$, and a buffer output connected to the sampling node (node B) and configured to provide a voltage signal at the source terminal of the sampling transistor dependent on the input voltage signal. The buffer circuit 330 may be referred to as a first buffer circuit.

The second buffer circuit 340 is advantageous since the first buffer circuit 330 of FIG. 6 may generate a delay between its buffer input (node D) and its buffer output (node A), along the upper branch of the switching circuit. That is, the second buffer circuit 340 can be placed along the bottom branch of the switching circuit in order to complement or match the delay of the upper branch. This second buffer circuit 340 may also be referred to as a complementary buffer, a delay buffer or a matching buffer. The second buffer circuit 340 may be described as being complementary to the first buffer circuit 330.

The second buffer circuit 340 also isolates the input $V_{IN}$ from $R_{samp}$, the equivalent impedance of the sampling switch $M_S$ and sampling capacitor $C_S$ as mentioned earlier, and helps improve Si, as the equivalent impedance $R_{EQ}$ of the parallel upper and lower branches becomes approximately equal to $R_3+R_4$ (and therefore can be better defined by those passive impedance values).

The first and second buffer circuits 330 and 340 may be configured such that the second buffer delay (of the second buffer circuit 340) is substantially same as the first buffer delay (of the first buffer circuit 330). The second buffer delay may be configured to be different from the first buffer delay in some arrangements. In order to best match the phase delay of the first buffer circuit 330, the first and second buffer circuits may be configured such that the second buffer circuit 340 is substantially the same as the first buffer circuit 330. The first and second buffer circuits may comprise the same type and quantity of buffers as each other. The first and second buffer circuits 330 and 340 may comprise any buffer circuit configuration as explained above with reference to FIG. 5.

Figure 7:
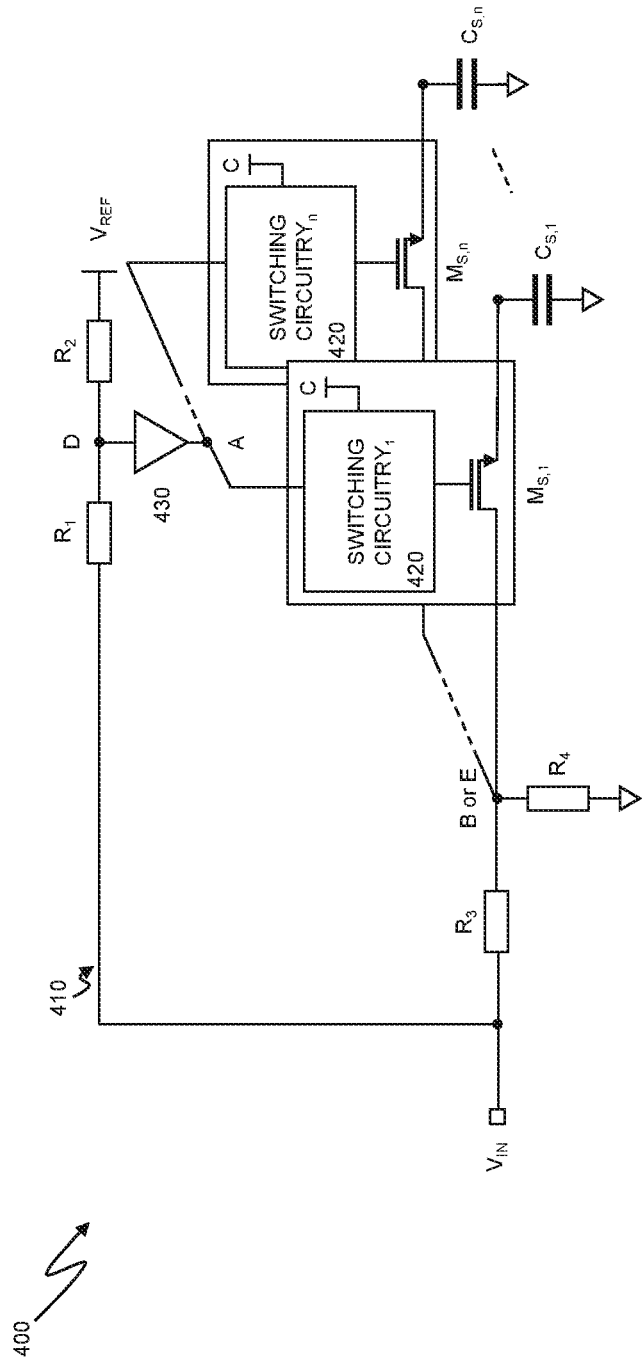
FIG. 7 shows a schematic diagram equivalent to FIG. 4 including multiple channels.

FIG. 7 is a schematic diagram of a sampling switch circuit 400, embodying the present invention. As before, the sampling switch circuit 400 may be referred to for example as a sampling circuit, a sampler circuit, a sampler front-end circuit, an ADC front-end circuit, a sample-and-hold circuit or a sample and hold switch circuit.

In overview, the sampling switch circuit 400 is similar to the sampling switch circuit 200, with a main difference being that the circuit is configured to comprise multiple channels arranged for time-interleaved operation. It will be appreciated that such a configuration may be useful as the front-end of a time-interleaved ADC.

The switching circuitry 420 may be the same as the switching circuitry 120 or 120A as described earlier, or switching circuitry 120B or 120C as described later in relation to FIGS. 9 and 10. The potential divider circuit 410 may be the same as the potential divider circuit 110 as described earlier. The buffer circuit 430 may be the same as the buffer circuit 230 as described earlier. Accordingly, duplicate description will be omitted.

For simplicity, the circuit 200 of FIG. 4 has been used as the basis of circuit 400, with the input node $V_{IN}$, the track-control node (node A), the sample node (node B), the first and second reference signal nodes, the potential divider circuit 410 and buffer circuit 430 being common to (i.e. shared between) the different channels.

Each channel has its own switching circuitry 420 and its own sampling transistor $M_{S,n}$. Each channel's switching circuitry 420 is controlled by its own clock signal CLK (not shown), the switching circuitry then connected between the track-control node (node A) and the gate of the channel's sampling transistor. Each channel has its own output node with a corresponding sampling capacitor $C_{S,n}$. The elements in each channel have been labelled accordingly to identify which of the n channels they are in. For example, $M_{S,1}$ belongs to channel 1 whereas $M_{S,n}$ belongs to channel n.

It will be appreciated that if the clock signals $CLK_1$ to $CLK_n$ (corresponding to channels 1 to n) are a set of time-interleaved clock signals, then the channels 1 to n will sample the input signal $V_{IN}$ in a time-interleaved fashion. That is, multiple sampling switches ($M_{S,1}$, $M_{S,2}$, ..., $M_{S,n}$) are driven with n clocking circuits (switching circuits 420) which are driven with n sampling clocks ($CLK_1$, $CLK_2$, ... $CLK_n$). As can be seen, each channel comprises its own switching circuitry and all are driven by the track-control node (node A).

Although the circuit 200 of FIG. 4 has been used as the basis of circuit 400, it will be appreciated that any of the other single-channel configurations disclosed herein (e.g. 200A or 300 described above, or 500 described below) could be used as the basis of a multi-channel configuration.

It will be also be appreciated that while a second buffer circuit corresponding to the second buffer circuit 340 has not been shown in FIG. 7, the placement of a second buffer circuit between the input node, and the source terminal of the sampling transistor/s may be a variation of circuit 400. As indicated in FIG. 7, this may be represented by a shared sampling node (node B) or a shared second buffer circuit input node (node E).

It will also be appreciated that a second buffer circuit may be placed in each channel between the input node, and the source terminal of the channel's respective sampling transistor as a further modification of the circuit 400. In this implementation, the second buffer circuits in each channel would have a common (shared) second buffer input node (node E) and each channel would have its own respective sampling node (node $B_n$).

Figure 7A:
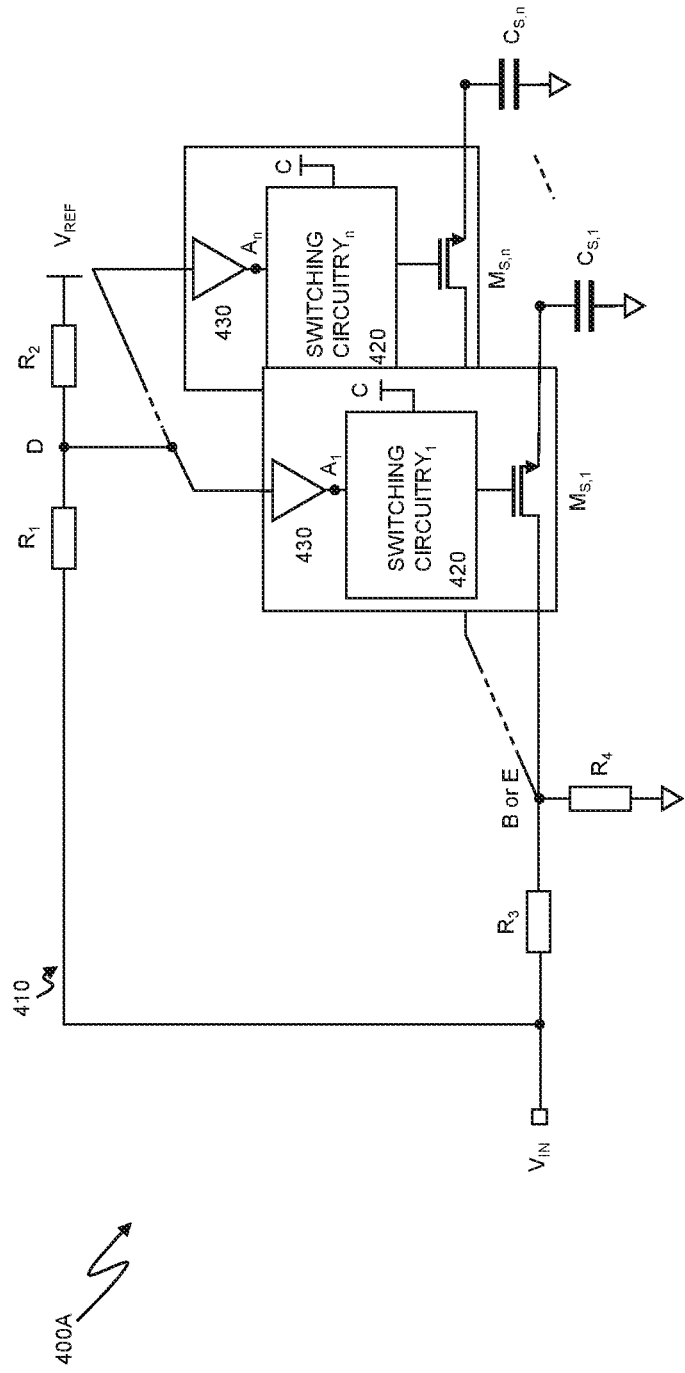
FIG. 7A shows a schematic diagram of an alternative circuit configuration of FIG. 7.

FIG. 7A is a schematic diagram of a sampling switch circuit 400A, embodying the present invention. As before, the sampling switch circuit 400A may be referred to for example as a sampling circuit, a sampler circuit, a sampler front-end circuit, an ADC front-end circuit, a sample-and-hold circuit or a sample and hold switch circuit.

In overview, the sampling switch circuit 400A is similar to the sampling switch circuit 400, with a main difference being that each channel comprises its own buffer circuit 430 instead of a common buffer circuit (i.e. a buffer circuit shared by n channels). Subsequently, each channel comprises its own track-control node $A_n$ at the buffer output.

The buffer circuits used in each channel may be the same as the buffer circuits used in other channels. In order to have consistent power draw, delay or other desirable circuit properties across all channels, the buffer circuits used in each channel may be substantially the same, and the type and quantity of buffers used in the buffer circuit may be substantially the same.

A configuration involving per-channel buffers may lend itself to applications involving higher power consumption or where multiple channels are used simultaneously.

Figure 8:
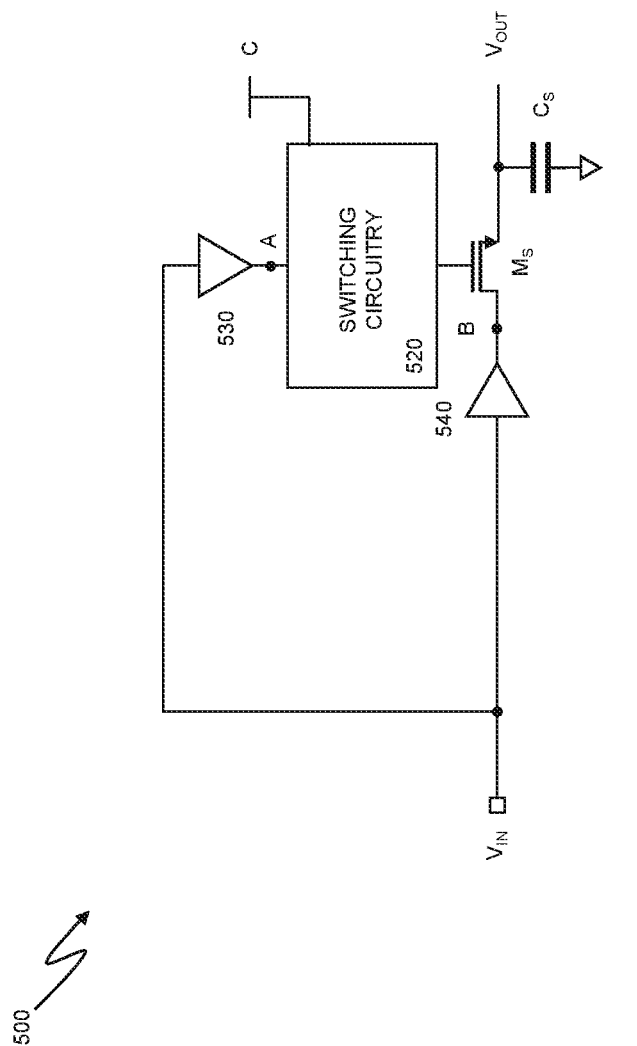
FIG. 8 shows a schematic diagram showing a simplified circuit model representing an alternative circuit configuration.

FIG. 8 is a schematic diagram of a sampling switch circuit 500 embodying the present invention. As before, the sampling switch circuit 500 may be referred to for example as a sampling circuit, a sampler circuit, a sampler front-end circuit, an ADC front-end circuit, a sample-and-hold circuit or a sample and hold switch circuit.

Circuit 500 shows a simplified implementation of switching circuit 300 where the potential divider circuit 310 (i.e. first and second reference nodes and first to fourth impedances $R_1$ to $R_4$) is omitted. Put another way, circuit 500 is the same as circuit 300 but where $R_1$, $R_2$ and the first reference node are omitted from the upper branch, and $R_3$, $R_4$ and the second reference node are omitted from the lower branch. For simplicity, first buffer input node (node D) and second buffer input node (node E) have been omitted since the potential divider circuit has been removed and both nodes are effectively the input node $V_{IN}$.

In circuit 500, the buffer circuit 530 corresponds to the first buffer circuit 330 and the buffer circuit 540 corresponds to the second buffer circuit 340.

In some arrangements, the buffer circuit 530 may be configured to provide a DC voltage shift which is sufficiently larger than a DC voltage shift provided by the buffer circuit 540 to cause the sampling transistor $M_S$ to be ON in the sampling (tracking) phase.

Some arrangements may allow the omission of the potential divider circuit since they may comprise a large input signal $V_{IN}$ capable of driving the buffer circuit 530 without the need of the voltage provided by the potential divider, or voltage shift block 250A of FIG. 4A.

The sampling switch circuit 500 may be useful where input impedance matching is not critical, for example to reduce loading at $V_{IN}$. A variation of sampling switch circuit 500, where input impedance matching (and $S_{11}$) is a consideration (in addition to loading at $V_{IN}$), may retain $R_3$, $R_4$ and the second reference node from the potential divider circuit 310 so that the second buffer circuit 540 is connected between nodes E and B in the same way as buffer circuit 340 in FIG. 6.

Figure 9:
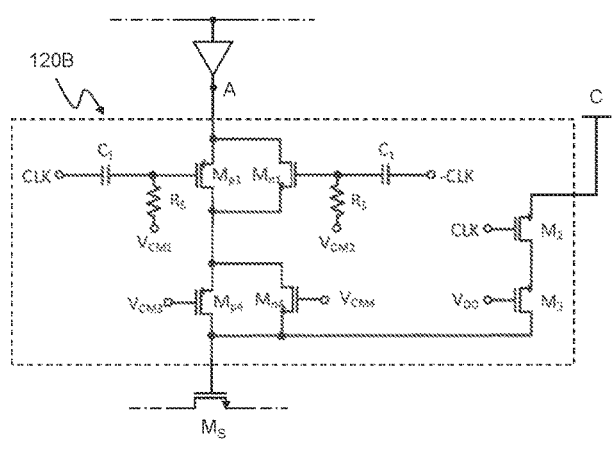
FIGS. 9 and 10 are examples of alternative switching circuitry configurations.

FIG. 9 is a schematic diagram of a switching circuitry configuration 120B, being a variation of switching circuitry 120A of FIG. 3A, configured to resolve an over-stress issue. For simplicity, unnecessary parts of the surrounding circuit have been omitted, shown by the dashed lines either side of the buffer circuit and the sampling transistor.

Transistor $M_3$ is added to protect $M_2$ when CLK is low. This guarantees that the drain voltage of $M_2$ remains below $V_{DD}$ when it is OFF. Similarly, transistors $M_{p4}$, and $M_{n4}$ are added to the circuit in order to protect transistors $M_{p1}$, $M_{n1}$ when CLK is high. The gates of $M_{p4}$, and $M_{n4}$ are biased with suitable common mode voltages, $V_{CM3,4}$. Also, DC voltages $V_{CM1,2}$ are added to the sampling clocks (i.e., CLK, and –CLK) through resistors $R_5$ and coupling capacitors $C_1$. It should be noted that these capacitors are added simply to AC couple the clock signal to the gate of transmission gate $M_{p1,n1}$. All the above-mentioned voltages, $V_{CM1}$-$V_{CM4}$, are DC voltages in this example.

The circuit 120B in FIG. 9 may be used in place of any switching circuitry block previously described (i.e. switching circuitry 220, switching circuitry 320 etc.).

Figure 10:
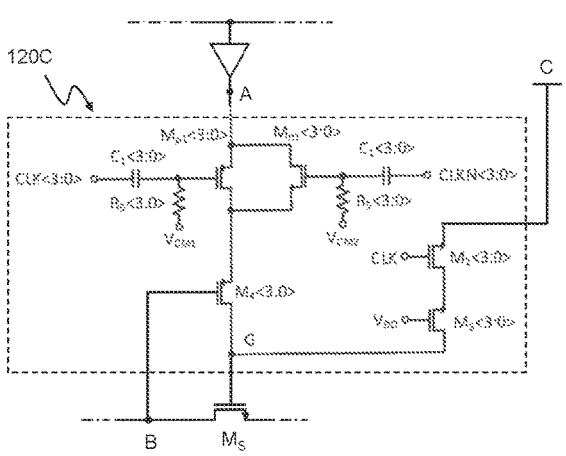

FIG. 10 is a schematic diagram of another switching circuitry configuration 120C, being a variation of switching circuitry 120A of FIG. 3A, configured as a simplified version of circuit 120B. Similarly, unnecessary parts of the surrounding circuit have been omitted as in FIG. 9.

In circuit 120C, the gate of transistor $M_4$ is connected to the sample node (node B). In this case, when CLK is low, the gate-source voltage over this device is constant similar to the sampling switch, $M_S$. This removes the need for a transmission gate ($M_{p4}$, and $M_{n4}$ as in FIG. 9) and also the DC voltages, $V_{CM3,4}$.

The circuit 120C in FIG. 10 may also be used in place of any switching circuitry block previously described. Indeed, to illustrate the applicability to the multi-channel circuitry of FIG. 7 the elements in FIG. 10 are denoted with <3:0> as being repeated to provide four channels, i.e. channels 0 to 3.

At high input frequencies, the amount of the input signal power passing through the sampling switch (through node B in FIG. 10) and also the clocking path (through node A) decreases. This limits the bandwidth of the sampling circuit 120C and eventually of an ADC comprising it.

In summary, the implementation of circuit 100 or 100A applies loading on the input signal and the speed of the clock used in the switching circuitry is dependent on the input signal due to the sizing of resistors $R_1$ and $R_2$. This affects the impedance/reflection coefficient $S_{11}$, and maximum input bandwidth. In addition, there is no method of ensuring over-voltages are not generated in switching circuitry without affecting the performance of the circuit with more load. Design of $V_{REF}$ in an example implementation of FIG. 3 or 3A requires a 1.8V supply (compared to $V_{DD}$=0.9V).

By adding a buffer at the output of the voltage shifting resistors $R_1$ and $R_2$, as in circuit 200, improvements can be made to the speed of the switching circuitry clock and the load on the input signal can be reduced (enabling improved input impedance matching and $S_{11}$ at $V_{IN}$). The buffer can also ensure that the common mode of switching circuitry voltages is within the safe operating area.

The resistors $R_1$ and $R_2$ can be increased in resistance to improve the impedance/reflection coefficient $S_{11}$ and reduce the loading on the input signal by reducing the current. This sizing is configured as a function of the bandwidth (BW) and input buffer load. The buffer can provide the necessary current required for the overall speed of the circuit. Resistors $R_3$ and $R_4$ may represent a 50 Ohm equivalent input network, which may be used for impedance matching.

To remove the need to use the 1.8V supply for $V_{REF}$ in the example implementation of FIG. 3 or 3A mentioned above, and to ensure that the input load of the buffer remains negligible, multiple buffers may be used in series. This results in the following input/output relationship where $V_{OUT}=N*V_{TH}+(RA/(RA+1))*(V_{IN}+V_{REF})$ (where N is the number of buffers, $V_{TH}$ is the threshold of a source-follower implementation of the buffer circuit and RA is ratio of the voltage shift resistors). This may then allow for a first reference node and $V_{REF}$ signal originating from a 0.9V supply and a smaller input load may be seen by the input signal.

If multiple phases/samples are required, one voltage shift block (250A, comprising resistors $R_1$, $R_2$ and first reference node $V_{REF}$) and the buffer circuit can be used to supply the multiple channels comprising switching circuitry used for each phase/sample. If phases/samples are interleaved, the buffer circuit driveability remains the same as the instantaneous power remains the same where one channel is used at a time.

As mentioned above, a sampling switch circuit embodying the present invention may be implemented as part of an ADC, for example as its front-end to generate voltage mode samples $V_{OUT}$ of a input signal $V_{IN}$, at a sample rate defined by a clock signal CLK as described earlier.

Figures 11, 12:
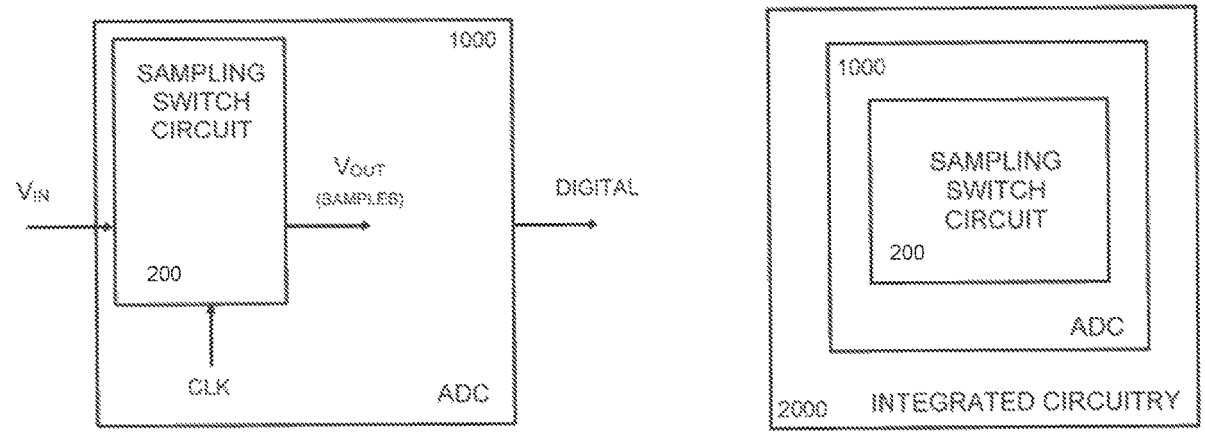
FIG. 11 is a schematic diagram of an ADC embodying the present invention.
FIG. 12 is a schematic diagram of integrated circuitry embodying the present invention.

FIG. 11 is a schematic diagram of such an ADC 1000 embodying the present invention. The ADC 1000 comprises any of the sampling switch circuits disclosed herein, indicated as 200 in FIG. 11 for simplicity. The ADC 1000 may in turn output a digital signal, as shown, based on the voltage mode samples $V_{OUT}$.

Any of the circuitry disclosed herein may be implemented as integrated circuitry or as an integrated circuit, for example as (or as part of) and IC chip, such as a flip chip. FIG. 12 is a schematic diagram of integrated circuitry 2000 embodying the present invention. The integrated circuitry 2000 may comprise the ADC 1000 and/or any of the sampling switch circuits previously disclosed herein, indicated as 200 in FIG. 12 for simplicity.

Integrated circuitry 2000 may be representative of some or all of an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The invention claimed is:

1. A sampling switch circuit, comprising:
    an input node, connected to receive an input voltage signal;
    a sampling transistor comprising a gate terminal, a source terminal and a drain terminal, the source terminal connected to the input node;
    a hold-control node connected to receive a hold-control voltage signal;
    an output node connected to the drain terminal of the sampling transistor;
    a buffer circuit having a buffer input connected to the input node and a buffer output connected to a track-control node, the buffer circuit configured to provide a track-control voltage signal at the track-control node dependent on the input voltage signal; and
    switching circuitry configured to connect the gate terminal of the sampling transistor to the track-control node or to the hold-control node in dependence upon a clock signal.

2. The sampling switch circuit as claimed in claim 1, comprising a potential divider circuit connected to the input node and the buffer input to provide a buffer-input voltage signal dependent on the input voltage signal at the buffer input.

3. The sampling switch circuit as claimed in claim 2, wherein the potential divider circuit is connected to a sample node to provide a sample voltage signal dependent on the input voltage signal at the sample node, the source terminal of the sampling transistor connected to the sample node and connected to the input node via the sample node.

4. The sampling switch circuit as claimed in claim 2, wherein the potential divider circuit comprises:
    a first impedance connected between the input node and the buffer input;
    a second impedance connected between the buffer input and a first reference node;
    a third impedance connected between the input node and the sample node; and
    a fourth impedance connected between the sample node and a second reference node,
    wherein:
    the first reference node is connected to receive a first DC reference voltage signal and the second reference node is connected to receive a second DC reference voltage signal.

5. The sampling switch circuit as claimed in claim 4, wherein:
    the first to fourth impedances have impedance values configured such that an input impedance at the input node is substantially defined by the third and fourth impedances; and/or
    a sum of the impedance values of the first and second impedances is X times bigger than a sum of the impedance values of the third and fourth impedances, where X≥2, and optionally where X≥5.

6. The sampling switch circuit as claimed in claim 1, wherein the buffer circuit comprises a single buffer connected between its buffer input and its buffer output or a plurality of buffers connected together between its buffer input and its buffer output.

7. The sampling switch circuit as claimed in claim 6, wherein:
    the buffer circuit comprises said plurality of buffers; and
    those buffers are connected together in series between the buffer input and the buffer output.

8. The sampling switch circuit as claimed in claim 6, wherein the single buffer or at least one of the plurality of buffers comprises:
    a source follower; or
    an operational amplifier.

9. The sampling switch circuit as claimed in claim 1, wherein:
    the buffer circuit is a first buffer circuit; and
    the sampling switch circuit comprises a second buffer circuit, the second buffer circuit having a buffer input connected to the input node, optionally via the sample node, and a buffer output connected to the source terminal of the sampling transistor and configured to provide a voltage signal at the source terminal of the sampling transistor dependent on the input voltage signal.

10. The sampling switch circuit as claimed in claim 9, wherein:
    the first buffer circuit generates a first buffer delay between its buffer input and its buffer output;
    the second buffer circuit generates a second buffer delay between its buffer input and its buffer output; and
    the first and second buffer circuits are configured such that the second buffer delay is substantially the same as the first buffer delay and/or such that when the gate terminal of the sampling transistor is connected to the track-control node a voltage signal provided at the gate terminal of the sampling transistor is substantially in phase with a voltage signal provided at the source terminal of the sampling transistor.

11. The sampling switch circuit as claimed in claim 9, wherein the second buffer circuit is substantially the same as the first buffer circuit.

12. The sampling switch circuit as claimed in claim 1, configured to have multiple channels, wherein:
    each said channel comprises its own said sampling transistor, output node, switching circuitry and clock signal; and
    for each said channel, the source terminal of the sampling transistor is connected to the input node, the output node is connected to the drain terminal of the sampling transistor, and the switching circuitry is configured to connect the gate terminal of the sampling transistor to the track-control node or to the hold-control node in dependence upon the clock signal.

13. The sampling switch circuit as claimed in claim 12, wherein each said channel comprises its own said buffer circuit.

14. An analogue-to-digital converter, comprising the sampling switch circuit as claimed in claim 1.

15. Integrated circuitry, such an IC chip, comprising the analogue-to-digital converter as claimed in claim 14.

16. Integrated circuitry, such an IC chip, comprising the sampling switch circuit as claimed in claim 1.

* * * * *